(12) United States Patent
Davey

(10) Patent No.: US 6,255,815 B1
(45) Date of Patent: Jul. 3, 2001

(54) MAGNETIC FIELD CALIBRATION DEVICE INCLUDING HOUSING WITH LOCATOR WINDOW

(75) Inventor: Kent R. Davey, New Smyrna Beach, FL (US)

(73) Assignee: Neotonus, Inc., Marietta, GA (US)

( * ) Notice: Subject to any disclaimer, the term of this patent is extended or adjusted under 35 U.S.C. 154(b) by 0 days.

(21) Appl. No.: 09/137,209

(22) Filed: Aug. 20, 1998

(51) Int. Cl.⁷ .................... G01R 33/02; G01R 35/00; H01F 27/02; H01F 27/30
(52) U.S. Cl. .................. 324/258; 324/202; 324/260; 336/92
(58) Field of Search .................. 324/67, 127, 202, 324/205, 228, 239, 244, 258, 260–262, 529, 545, 546; 336/90, 92, 192

(56) References Cited

U.S. PATENT DOCUMENTS

| | | | | |
|---|---|---|---|---|
| 1,241,963 | * | 10/1917 | Grove | 324/67 |
| 2,103,179 | * | 12/1937 | Rennau | 324/546 |
| 2,542,057 | * | 2/1951 | Relis | 324/204 X |
| 2,802,182 | * | 8/1957 | Godshalk et al. | 324/127 X |
| 3,836,848 | * | 9/1974 | Blevins | 324/67 |
| 3,979,566 | * | 9/1976 | Willy . | |
| 5,017,877 | * | 5/1991 | Haus, Jr. | 324/258 X |
| 5,432,437 | * | 7/1995 | Turner | 324/202 X |
| 5,434,500 | * | 7/1995 | Hauck et al. | 324/258 X |

FOREIGN PATENT DOCUMENTS

2352305 * 12/1977 (FR) .

* cited by examiner

*Primary Examiner*—Gerard R. Strecker
(74) *Attorney, Agent, or Firm*—Levisohn, Lerner, Berge & Langsam

(57) ABSTRACT

A device for measuring and calibrating the strength of magnetic fields is provided. The device includes a coil of wire and either conductive pads or an ammeter/voltmeter attached to the coil of wire. The coil is disposed in the interior of a housing, and a locator window is formed in the housing in a position internal to the coil. The locator window allows the user to see through the device and thus position the device properly with respect to the source of the magnetic field. Preferably, a microprocessor is provided which converts a value of voltage or current induced in the coil into a value of magnetic field strength. The microprocessor transmits the value of magnetic field strength to the display.

10 Claims, 1 Drawing Sheet

MAGNETIC FIELD CALIBRATION DEVICE INCLUDING HOUSING WITH LOCATOR WINDOW

BACKGROUND OF THE INVENTION

This invention relates to measuring devices and more specifically to a portable device for measuring magnetic field strength.

Therapeutic magnetic stimulation of human nerve tissue has significant advantages over traditional direct electrical stimulation. Electrical stimulation requires that an electrically conductive gel or buffer solution be applied between the electrodes supplying current and the surface of the skin of the patient. Long term excitation of the nerves is often accompanied by skin irritation caused by current concentration at the electrode/skin interface.

By contrast, magnetic stimulation does not even require direct contact with the patient, because magnetic stimulation causes current to be induced in the target tissues. Rapidly changing magnetic fields induce electric fields in biological tissue; when properly oriented and of the correct magnitude, the magnetically induced electric field transfers charge directly into the nerve tissue. When the localized membrane potential inside the nerve rises to a certain level, the nerve "fires." An excellent device and method for the implementation of magnetic stimulation of nerve tissue is described in U.S. Pat. No. 5,725,471, entitled "Magnetic Nerve Stimulator for Exciting Peripheral Nerves" to Davey et al. (the same Davey as is the inventor of the present invention), the teachings of which are incorporated by reference herein.

While magnetic stimulation is safer and easier to administer than direct electrical stimulation, it is important that the stimulator device maintain the proper magnetic field strength. If the magnetic field strength is too low, the charge induced in the target nerves will be too low and the nerves will be understimulated. However, if the magnetic field generated by the device is too strong, then the charge induced in the target nerves will be too high and injury may result.

SUMMARY OF THE INVENTION

Accordingly, it is an object of the invention to enable a medical practitioner or field technician to determine quickly and accurately the field strength of the magnetic field generated by a magnetic nerve stimulator and to insure that the field is within the range set by the manufacturer as appropriate for its intended use.

It is another object of the invention to provide a device for accurately measuring magnetic field strengths.

It is another object of the invention to provide a device for measuring magnetic field strengths that is easy to use.

The above and other objects are fulfilled by the invention which includes a magnetic field calibration device, having a coil of wire and conductive connectors attached to the coil of wire. The coil is disposed in the interior of a housing, and a locator window is formed in the housing in a position internal to the coil; that is, the coil circumscribes or substantially surrounds the locator window. The housing is preferably substantially planar and the locator window includes a hole formed all the way through the housing extending from a first primary side of the housing to an opposite second primary side of the housing. The locator window may preferably include an at least partially light transmissible section of housing formed on the first primary side and another at least partially light transmissible section of housing formed on the second primary side. Preferably, these sections of housing are clear and allow the user to see through the device via the locator window. The locator window allows the user to position the device properly with respect to the source of the magnetic field, thereby increasing the accuracy with which the device may be employed.

The coil preferably includes approximately 4–5 turns of wire. The conductor pads attached to the coil are attachable to a voltmeter, ammeter, or oscilloscope, so that the current induced in the coils by the magnetic field is detectable and measurable. The strength of the magnetic field is proportional to the current induced in the coil; thus, if one measures the current induced in the coil, one can readily determine the strength of the magnetic field. The conductor pads may be predominantly flat so that clip leads may be attached to them for connecting the coil to an oscilloscope or voltmeter/ammeter, or the conductor pads may be male terminals (i.e., prong-like) attachable to mating female terminals of the voltmeter or oscilloscope.

The invention also includes a magnetic field calibration device, having a coil of wire and a built-in voltmeter or ammeter, attached to the coil of wire, for reading voltage/current induced in the coil when the device is placed in a magnetic field. The coil and the voltmeter are disposed in the interior of the housing, and the voltmeter preferably includes a display formed on an outer surface of the housing. Preferably, the voltmeter determines the current induced in the coil and the display indicates a value of magnetic field strength corresponding to the magnetic field which the device is measuring. More preferably, a microprocessor is disposed in the interior of the housing and connected to the display and the coil which converts a value of voltage induced in the coil into a value of magnetic field strength; the microprocessor transmits the value of magnetic field strength to the display. The microprocessor may need to be shielded from the effects of the magnetic field being measured. This embodiment also includes the locator window to enable quick and accurate placement of the device on the magnetic nerve stimulator device.

DETAILED DESCRIPTION OF THE DRAWINGS AND EMBODIMENTS

Figure 1:
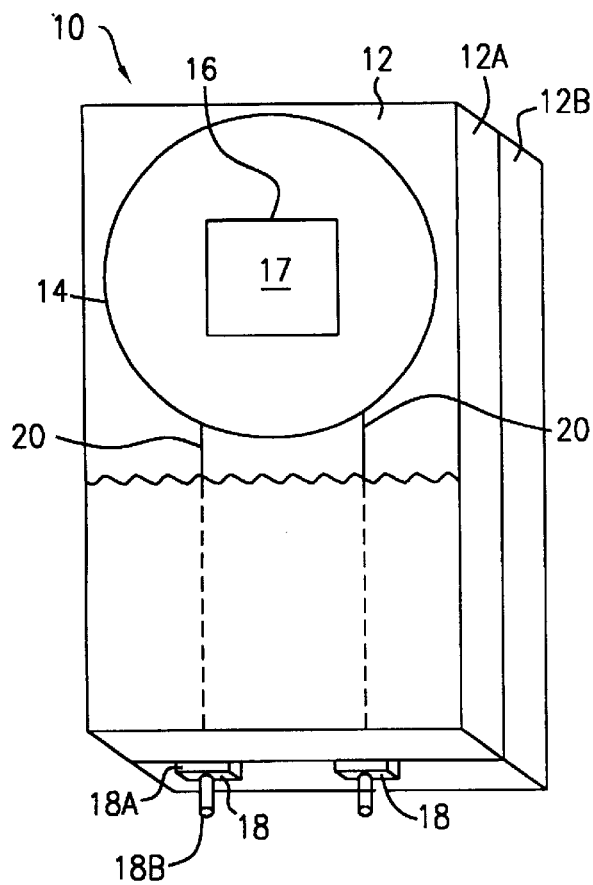
FIG. 1 is a broken perspective schematic of an alternate embodiment of a magnetic field strength calibrator according to the invention.

Description of the invention will now be given with reference to the appended drawings, FIGS. 1 and 2. In both FIGS. 1 and 2, a magnetic field strength calibrator 10 is provided with a housing 12, preferably comprising two halves 12A and 12B. Disposed inside the housing 12 is wire coil 14; coil 14 preferably includes 2–3 turns of wire. Locator window 16 is cut through housing 12. That is, window 16 is cut through both halves 12A and 12B of housing 12, which enables a user to see through the calibrator 10 via window 16. Window 16 preferably includes a clear portion 17 on the front and back halves 12A and 12B of housing 12. Providing clear portions 17 allows the user to see through the calibrator 10 while keeping the housing sealed and thus preventing dust and debris from entering the interior of the housing 12. Locator window 16 enables the user to position the calibrator 10 precisely in proper alignment with the source of the magnetic field. One intended use of the invention is that it be used with the magnetic nerve stimulator described in U.S. Pat. No. 5,725,471. Accordingly, the locator window 16 is roughly square to correspond to the cross-section of the magnetic core face of the nerve stimulator device. Other shapes of locator window may be used for other purposes.

In FIG. 1, which depicts the simpler embodiment of the invention, conductors or terminals 18 are provided at the bottom of calibrator 10. Terminals 18 are connected to coil 14 via lead wires 20. Terminals 18 are designed to allow a voltmeter, ammeter, or oscilloscope to be easily connected and thus read the current that is induced in coil 14 when the device is placed in a magnetic field. Terminals 18 may be flat conductor pads, to which alligator clip leads may be attached, or terminals 18 may be prong-like or pin-like structures to which female leads may be connected. In FIG. 1, terminals 18 are provided with both sets of geometry in the form of flat conductor pads 18A and prongs 18B. The terminals may also be female terminals to which male leads are attached. In either case, when the calibrator is placed in a magnetic field, a voltmeter or ammeter (not shown) may be connected to terminals 18, and the current induced in coil 14 may be measured. Because the induced current is proportional to the strength of the magnetic field, measuring the induced current enables a simple determination of the strength of the magnetic field. The magnetic field of the device being measured may be calibrated accordingly.

Figure 2:
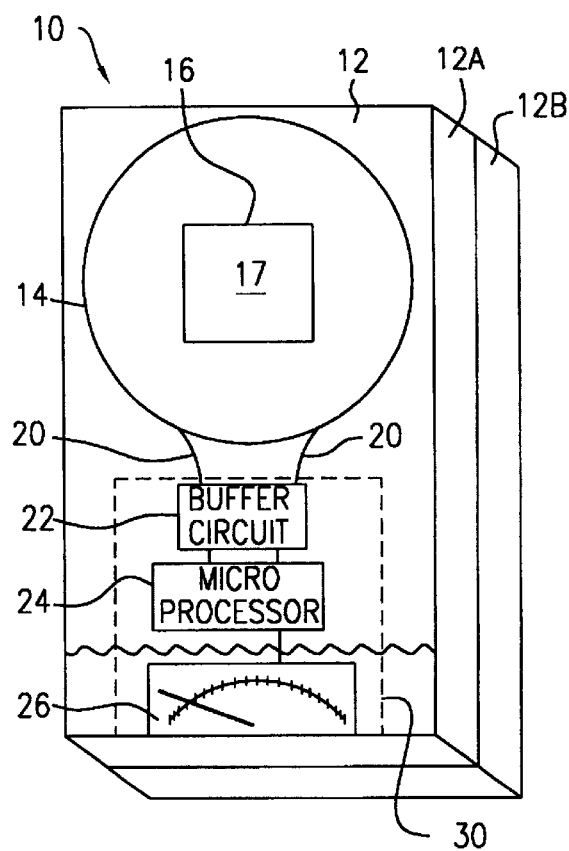
FIG. 2 is a broken perspective schematic and block diagram of a preferred embodiment of a magnetic field strength calibrator according to the invention.

FIG. 2 depicts the preferred embodiment of the invention. Reference numerals repeated from FIG. 1 refer to like parts; description of these parts will not be repeated. Instead of simply connecting terminals 18 to coil 14, in the preferred embodiment, lead wires 20 are connected to a buffer circuit 22 which, in turn, is connected to microprocessor 24. The buffer circuit is an optional portion of the invention which steps down the current from coil 14 before it reaches microprocessor 24 so that microprocessor 24 does not burn out from a current overload. It is possible to do without buffer circuit 22, as is known in the electrical arts.

In either event, microprocessor 24 receives voltage from coil 14 and establishes a value of that. Microprocessor 24 then converts the value of the voltage into a value of magnetic field strength and sends the value for magnetic field strength to display readout 26. Alternatively, the microprocessor need not convert the value to the magnetic field strength value but may instead simply forward the voltage value to display readout 26. Thus, buffer circuit 22, microprocessor 24, and display 26 collectively form a built-in voltmeter 30 disposed in the interior of housing 12 of calibrator 10. By providing an integral voltmeter 30, the calibrator 10 does not need to be attached to another device. If the microprocessor 24 is configured to have display readout 26 show magnetic field strength values, then no further calculations are required.

In operation, the preferred embodiment works as follows. The calibrator 10 is placed in a magnetic field, aligning locator window 16 with the cross-section of the source of the magnetic field. The magnetic field induces voltage in coil 14. That voltage is conducted via lead lines 20 to buffer circuit 22 and thereupon to microprocessor 24. Microprocessor 24 determines the value of the voltage, converts it to a value of magnetic field strength, and sends the magnetic field strength value to display readout 26. The display graphically shows the strength of the magnetic field, and the field generator may thus be calibrated. Alternatively, the microprocessor can have a stored value of the desired voltage or magnetic field strength of the device being measured and a comparator means. This arrangement will produce an output signal to the display indicative of, for example, "within acceptable range", or "too low" or "too high."

Housing 12 is preferably made of molded plastic for low cost and ease of manufacturing. Microprocessor 24 is preferably provided with shielding to prevent the magnetic field which the device is measuring from interfering with or ruining the microprocessor.

The invention is not limited to the above description or the appended figures. For example, FIG. 2 depicts an analog display readout 26; the invention also contemplates the use of an LED readout and/or an LCD readout. Also, while it is preferred to use 4–5 turns of wire for coil 14, any convenient number of turns of wire would be within the scope of the invention. Further, the above description makes reference to the preferred embodiment having a built-in voltmeter 30. However, it is equally contemplated as being part of the invention to provide the same calibrator with a built-in ammeter or the like.

The above specification and the detailed description of the preferred embodiment are to be considered as representative only, as the scope of the invention to which we are entitled is intended to be covered by the scope of the claims, as interpreted by the Courts, and their reasonable and legal equivalents, as also interpreted by the Court under the applicable statutes.

What is claimed is:

1. A magnetic field calibration device for a magnetic nerve stimulator having a core, comprising:

a coil of wire;

an electrical detector attached to said coil of wire, for reading at least one of voltage and current induced in said coil when said device is placed in a magnetic field produced by the core;

a housing having an interior, said coil and said electrical detector disposed in said interior, said electrical detector having a display formed on an outer surface of said housing; and a visual locator window, formed in said housing, circumscribed by said coil so that said coil can be visually located in front of the core of the magnetic nerve stimulator, wherein said visual locator window is adapted to enable a user to see straight through said housing from a first primary side of said housing to an opposite second primary side of said housing and thus enables the user to position said device properly in front of the core of the nerve stimulator.

2. A magnetic field calibration device according to claim 1, wherein said housing is substantially planar and said locator window comprises a hole formed through said housing extending from said first primary side of said housing to said second primary side of said housing, said electrical detector display being disposed on one of said primary sides of said housing.

3. A magnetic field calibration device according to claim 2, said locator window further comprising a first at least partially light transmissible section of housing formed on said first primary side and a second at least partially light transmissible section of housing formed on said second primary side.

4. A magnetic field calibration device according to claim 1, wherein said coil comprises approximately 4–5 turns of wire.

5. A magnetic field calibration device according to claim 1, wherein said electrical detector determines one of the current and the voltage induced in said coil and displays a value of magnetic field strength corresponding to a magnetic field which said device is measuring.

6. A magnetic field calibration device according to claim 1, wherein said electrical detector determines one of the current and the voltage induced in said coil and said display indicates a value of magnetic field strength corresponding to a magnetic field which said device is measuring.

7. A magnetic field calibration device according to claim 1, wherein said electrical detector further comprises a microprocessor disposed in said interior and connected to said display and said coil, said microprocessor converting a first value of one of voltage and current induced in said coil into a second value of magnetic field strength and transmitting said second value to said display.

8. A magnetic field calibration device according to claim 7, further comprising a buffer circuit, connected between said coil and said microprocessor for stepping down the one of said voltage and current before the one of said voltage and current reaches said microprocessor.

9. A magnetic field calibration device according to claim 1, wherein said electrical detector comprises a voltmeter for reading voltage induced in said coil.

10. A magnetic field calibration device according to claim 1, wherein said electrical detector comprises an ammeter for reading current induced in said coil.

* * * * *